(12) United States Patent
Van Wershoven

(10) Patent No.: US 6,876,234 B2
(45) Date of Patent: Apr. 5, 2005

(54) INTEGRATED CIRCUIT WITH OUTPUT DRIVERS

(75) Inventor: Loesje Maria Jacoba Van Wershoven, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 185 days.

(21) Appl. No.: 10/022,124

(22) Filed: Oct. 30, 2001

(65) Prior Publication Data
US 2002/0125921 A1 Sep. 12, 2002

(30) Foreign Application Priority Data
Nov. 2, 2000 (EP) .............................................. 00203826

(51) Int. Cl.[7] .................................................. H03K 3/00
(52) U.S. Cl. ........................ 327/108; 327/382; 327/379
(58) Field of Search ........................... 327/108, 91, 94, 327/344, 336, 356, 308, 321; 357/635, 211, 275; 716/17

(56) References Cited

U.S. PATENT DOCUMENTS

| 5,193,200 A | * | 3/1993 | Asprey et al. .............. 345/168 |
| 6,028,465 A | * | 2/2000 | So .............................. 327/321 |
| 6,307,401 B1 | * | 10/2001 | Bridgewater, Jr. ........... 326/86 |
| 6,448,631 B2 | * | 9/2002 | Gandhi et al. .............. 257/635 |
| 6,507,225 B2 | * | 1/2003 | Martin et al. ............... 327/108 |
| 6,594,813 B1 | * | 7/2003 | Gandhi et al. ................ 716/17 |
| 6,642,768 B1 | * | 11/2003 | Schell et al. ................ 327/308 |

* cited by examiner

Primary Examiner—Tuan T. Lam
Assistant Examiner—Hiep Nguyen
(74) Attorney, Agent, or Firm—Aaron Waxler

(57) ABSTRACT

An integrated circuit is provided with at least two output drivers (4) without substrate contacts. The integrated circuit is further provided with at least a core with a Vssc contact (7, 9) and a periphery provided with at least one Vssq contact (8). A resistance (11) with a value of between 100 and 300 ohms lies between each Vssq contact (8) and the Vssc contact (7, 9). The value of the resistance (11) is preferably greater than 250 ohms in the case of output drivers which are not slew-rate controlled, and the value of the resistance (11) is preferably at most 250 ohms in the case of slew-rate controlled output drivers. The resistance (11) may be provided in the Vssq pad.

3 Claims, 3 Drawing Sheets

INTEGRATED CIRCUIT WITH OUTPUT DRIVERS

The invention relates to an integrated circuit provided with at least two output drivers without substrate contacts and further provided with at least a core region with a Vssc contact and a periphery region provided with at least one Vssq contact.

Integrated circuits are becoming ever more complicated in the course of time. The number of output drivers increases, as does their complexity. To reduce the ground bounce, the number of output drivers per Vddq/Vssq contact pair (Vddq and Vssq being the supply voltage contact and the ground contact, respectively, of the periphery) must remain limited. Output drivers cause a considerable amount of ground bounce. To prevent this ground bounce propagating through the substrate to other regions, output drivers without substrate contacts were developed. The absence of substrate contacts of the output drivers implies that a capacitance will be present between each Vssq contact and the Vssc contact (Vssc is the ground contact of the core). If several different Vddq/Vssq pairs are used, said capacitance will cause a high capacitive coupling between Vssq and Vssc, and noise will appear at Vssc. Another side effect is that resonance is caused by the capacitance, the inductance of the connection pins, and the lateral resistance between the N-well and the substrate. This resonance may assume values which rise to above the value present at Vssq.

It is an object of the invention to reduce the ground bounce and the resonances at the Vssc contact if the integrated circuit has two or more output drivers without substrate contacts.

According to the invention, this object is achieved in that a resistance with a value lying between 100 and 300 ohms is present between each Vssq contact and the Vssc contact.

Two types of output drivers are known, i.e. drivers which are slew-rate controlled and which are not slew-rate controlled. Slew-rate controlled output drivers limit the di/dt at the output of the output driver and for this reason alone will reduce the ground bounce. Drivers which are not slew-rate controlled are to be used only where high speeds are required. Each output driver will contribute to a capacitance to the substrate. The smaller the number of output drivers, the smaller the total capacitance and the smaller the coupling to the substrate. The ground bounce will be limited if a small number op output drivers and supply voltage pairs Vddq/Vdds is used. Resonance, however, will always be present. The resonance may be damped by means of a parallel resistance between each Vssq contact and the Vssc contact.

The invention will now be discussed in more detail with reference to the accompanying drawings, in which.

Figure 1:
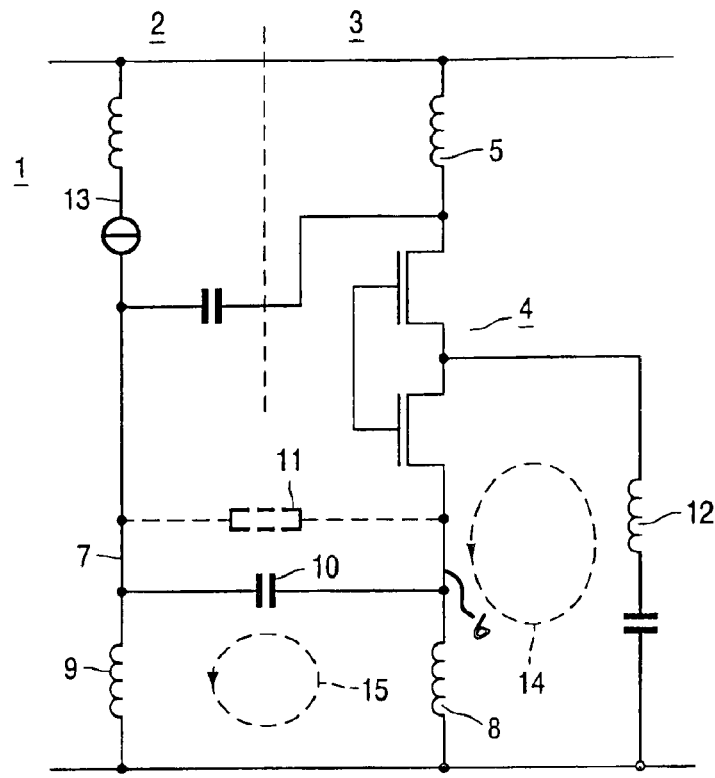
FIG. 1 is a simple model of an output driver with supply voltage contacts and a load.

FIG. 1 shows a circuit 1 with a core region 2 and a periphery region 3 in a simplified diagrammatic form. An output driver such as the standard inverter referenced 4 in FIG. 1 is provided in the periphery region and is supplied with a supply voltage via contacts Vddq 5 and Vssq 6. A Vssc contact 7 is present in the core region. Both the Vssc contact 7 and the Vssq contact 6 show a parasitic inductance, 8 and 9, respectively. The output driver is constructed without substrate contacts, which has the result that a capacitor 10 is present between the Vssc contact 7 and the Vssq contact 6. The output driver 4 may either be slew-rate controlled or not slew-rate controlled. The connection pins of the contacts 6 and 7 show a self-inductance which is referenced 8 and 9, respectively. FIG. 1 shows a Vddq/Vssq pair 5, 6. An integrated circuit nowadays comprises more than one such pair. FIG. 1 further shows an output driver 4 belonging to the Vddq/Vssq pair 5, 6. The number of output drivers 4 per Vddq/Vssq pair may also be greater than one. Finally, the number of supply voltage pair connections for the core, referenced Vddc/Vssc 13, 7, may be greater than one. The ground bounce and resonance are indicated with the broken-line circles 14 and 15, respectively. The number of output drivers and the number of supply voltage pairs determine the size of the capacitor 10 as well as the resonance frequency. The Q factor of the model shown in FIG. 1 can be written as:

$$Q=(R/n)\{(C_{buf},n,m)/[(Lvssc/c)+(Lvssq/n)]\}^{1/2}$$

in which n is the number of pairs Vddq/Vssq, m the number of output drivers per Vddq/Vssq pair, c the number of Vddc/Vssc pairs, Lvssc the inductance 9, Lvssq the inductance 8, $C_{buf}$ the capacitance of the capacitor 10, and R the resistance value of the lateral resistor between the NMOS source contact and the substrate (in the mega-ohm order of magnitude). References not yet defined have the following meanings herein. Vddc is the supply voltage connection of the core, Lvssc is the inductance of the ground connection of the core, and Lvssq is the inductance of the ground connection of the periphery. The greater the value of Q, the higher the peak value of the ground bounce and the longer it takes before the resonance has died down. It was found that the value of Q can be substantially reduced and accordingly the peak value of the ground bounce and the duration of the resonance can be considerably reduced if a resistance, referenced 11 in FIG. 1, is provided between the Vssq contact 6 and the Vssc contact 7, in particular if this resistance has a value of between 100 and 300 ohms.

The value of the resistance 11 may be determined with greater exactitude if a distinction is made between output drivers which are and output drivers which are not slew-rate controlled. The resistance R 11 should preferably have a value of between 100 and 250 ohms for output drivers 4 which are slew-rate controlled. The resistance R 11 should preferably have a value of between 250 and 300 ohms for output drivers 4 which are not slew-rate controlled.

In FIG. 2, time is plotted on the horizontal axis in units of 10 nanoseconds and voltage on the vertical axis in units of 50 millivolts. The same is true for FIGS. 3, 4, 5, and 6, and it will accordingly not be repeated for these Figures.

Figure 2A:
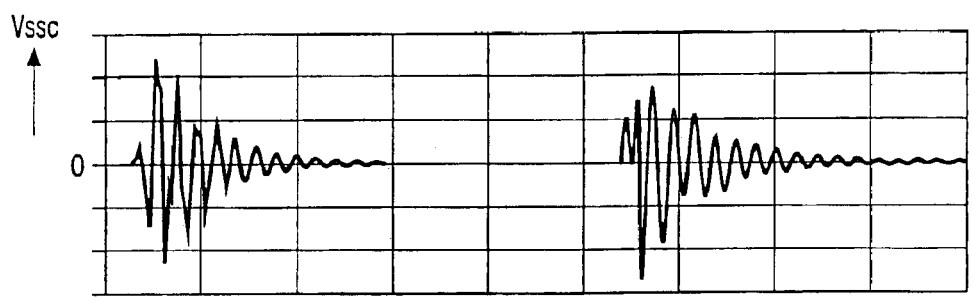
FIG. 2 shows signal diagrams a and b for comparing the ground bounce and the resonance between a situation without and a situation with an added resistance.
Figure 2B:
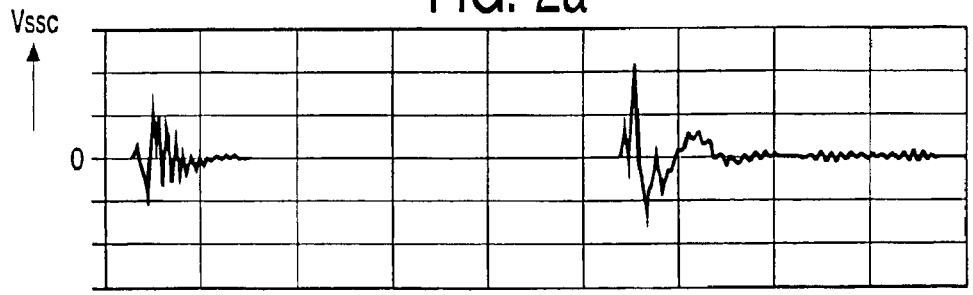

FIG. 2a shows the situation in which no resistance 11 was provided between the Vssq and Vssc contacts in a circuit with output drivers which are not slew-rate controlled, in an integrated circuit with one Vddc/Vssc pair, one Vddq/Vssq pair, and three output drivers which are not slew-rate controlled. The situation is shown in particular where all three not slew-rate controlled output drivers switch simultaneously, which leads to the maximum ground bounce for the relevant integrated circuit. FIG. 2a shows the situation without a resistance 11, and FIG. 2b shows the situation in which a resistance of 100 ohms is provided. It is clearly apparent that both the ground bounce and the resonance have been substantially reduced.

Figure 3A:
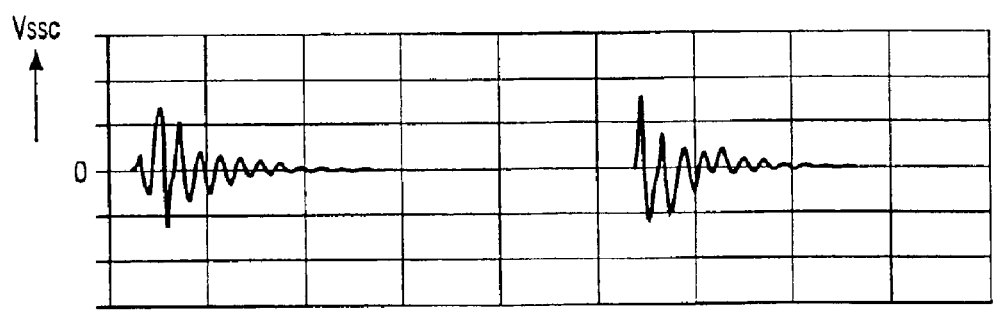
FIG. 3 shows signal diagrams a and b for comparing the ground bounce and the resonance between a situation without and a situation with an added resistance.
Figure 3B:
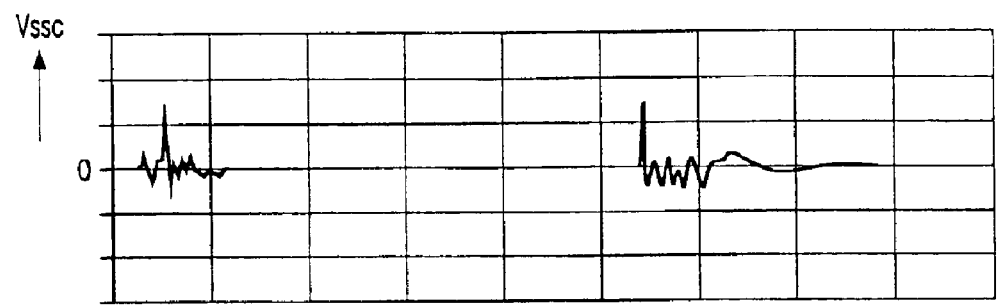

FIG. 3 shows the results of the provision of the resistance 11 in an integrated circuit with three slew-rate controlled output drivers, all three switching simultaneously, while one Vddc/Vssc pair and one Vddq/Vssq pair are present, as in FIG. 2. The value of the resistance 11 in this case is 100 ohms. Her again, the addition of the resistance 11 is found to lead to a substantial reduction in the ground bounce and the resonance.

Figure 4A:
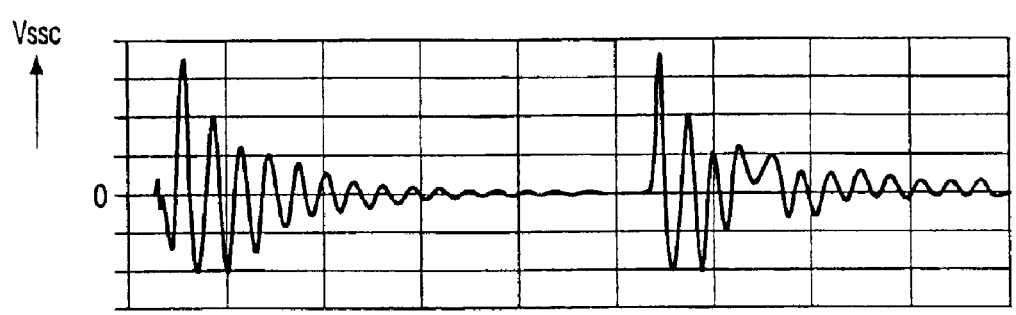
FIG. 4 shows signal diagrams a and b for comparing the ground bounce and the resonance between a situation without and a situation with an added resistance.
Figure 4B:
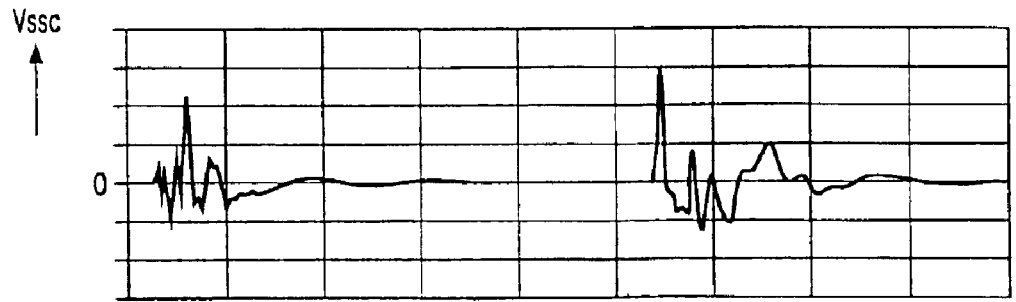

A situation is sketched in FIG. 4 which is comparable to that of FIG. 3. It relates again to an integrated circuit with one Vddc/Vssc pair and one Vddq/Vssq pair, but now with nine slew-rate controlled output drivers which all nine switch simultaneously. Again, a substantial reduction in the ground bounce and the resonance is found to occur.

Figure 5A:
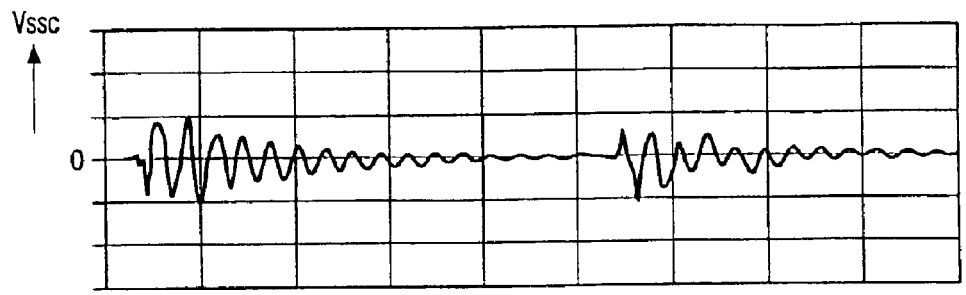
FIG. 5 shows signal diagrams a and b for comparing the ground bounce and the resonance between a situation without and a situation with an added resistance.
Figure 5B:
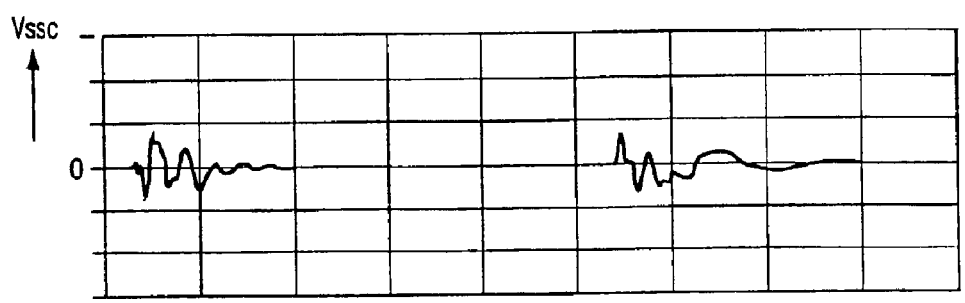

FIG. 5 relates to the same integrated circuit as FIG. 4; however, only three of the nine slew-rate controlled output drivers are switching. It is clearly apparent from FIG. 5 that the peak value of the ground bounce is determined by the number of switching output drivers, while the output drivers which do not switch do contribute to the total capacitance, with the result that the resonance is damped less quickly. The large influence of the provision of the resistance 11, in this case with a value of 100 ohms, on the amplitude of the ground bounce and the duration of the resonance is evident again from FIG. 5.

Figure 6A:
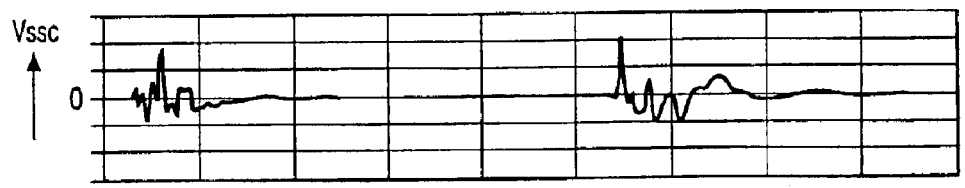
FIG. 6 shows signal diagrams a, b, and c for comparing the ground bounce and the resonance for different supply voltage pairs Vddq/Vdds, all with an added resistance.
Figure 6B:
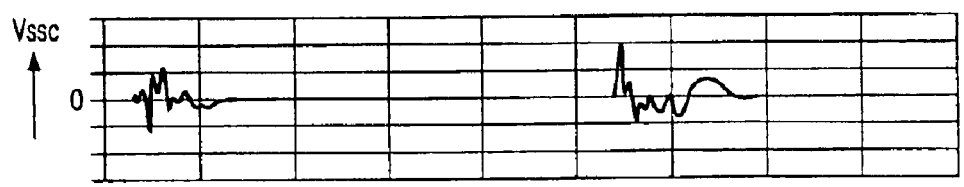
Figure 6C:
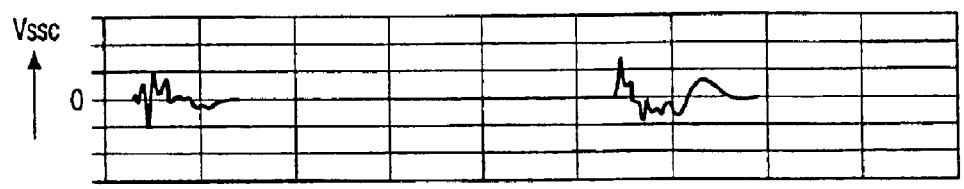

FIG. 6 indicates for three cases what is the influence of the number of output drivers per Vddq/Vssq pair. Each of the FIGS. 6a, 6b, and 6c, relates to an integrated circuit with six output drivers which switch all six simultaneously. A resistance 11 is also provided in all three cases. FIG. 6a shows the situation in which all six output drivers are supplied by means of one Vddq/Vssq pair. FIG. 6b shows the situation in which all six output drivers are supplied by means of two Vddq/Vssq pairs. FIG. 6c shows the situation in which all six output drivers are supplied by means of four Vddq/Vssq pairs. It is apparent from FIG. 6 that the distribution of a given number of output drivers over several Vddq/Vssq pairs does have some, albeit small, influence on the amplitude of the ground bounce and the resonance, but definitely much less than the mere addition of the resistance 11.

Various embodiments and modifications will now suggest themselves to those skilled in the art in view of the above. A1 such embodiments and modifications are deemed to fall within the scope of the invention.

What is claimed is:

1. An integrated circuit provided with at least two output driver without contacts to a substrate and further provided with at least a core region with a Vssc contact and a periphery region provided with at least one Vssq contact, characterized in that a resistance with a value lying between 100 and 300 ohms is provided between each Vssq contact and the Vssc contact.

2. An integrated circuit as claimed in claim 1, wherein the at least one output driver is not slew-rate controlled, characterized in that the value of the resistance is greater than 250 ohms.

3. An integrated circuit as claimed in claim 1, wherein the at least one output driver is slew-rate controlled, characterized in that the value of the resistance is at most 250 ohms.

* * * * *